Oct. 2, 1962 M. M. ATALLA 3,056,888

SEMICONDUCTOR TRIODE

Filed Aug. 17, 1960

INVENTOR
M. M. ATALLA
BY H. W. Lockhart
ATTORNEY

United States Patent Office 3,056,888

Patented Oct. 2, 1962

3,056,888

SEMICONDUCTOR TRIODE

Martin M. Atalla, Mountainside, N.J., assignor to Bell Telephone Laboratories, Incorporated, New York, N.Y., a corporation of New York Filed Aug. 17, 1960, Ser. No. 50,156
4 Claims. (Cl. 307—88.5)

This invention relates to signal translating devices. More particularly, this invention relates to analog semiconductor devices.

As is well known in the art, an analog semiconductor device is so termed because its structure is analogous to that of a vacuum tube triode. For example, the device includes three active elements corresponding to a cathode, an anode and a control grid. The operation of the device, moreover, is quite similar to that of the vacuum tube triode in that a space charge limited flow of current is modulated by a signal introduced at the grid. Accordingly, the device is useful in amplifiers and oscillators.

Prior art forms of analog semiconductor devices have had several disadvantages, however. Among these are difficulty of construction and relatively low frequency response. These disadvantages are overcome by this invention.

In its basic form, the invention comprises a dielectric coated semiconductor wafer which includes a high resistivity bulk portion and two spaced surface portions of high conductivity, preferably of conductivity type opposite that of the bulk, defining rectifying junctions with the bulk portion and connections to the two spaced surface portions simulating the cathode and anode of a vacuum tube. One of the rectifying junctions is forward biased and the other is reverse biased beyond the point necessary to extend the space charge layer associated with the junction across the region separating the two junctions. An electrode to the dielectric coating operates as a control grid controlling the flow of current from one surface portion to the other.

Therefore, one feature of this invention is a semiconductor wafer having two spaced high conductivity surface portions between which flows a space charge limited current, coupled with an electrically isolated means for modulating this current.

The invention and the several objects and features thereof will be understood more clearly and fully from the following detailed description with reference to the accompanying drawing, in which.

It is to be understood that the figures are for illustrative purposes only and, therefore, not necessarily to scale.

Figure 1:
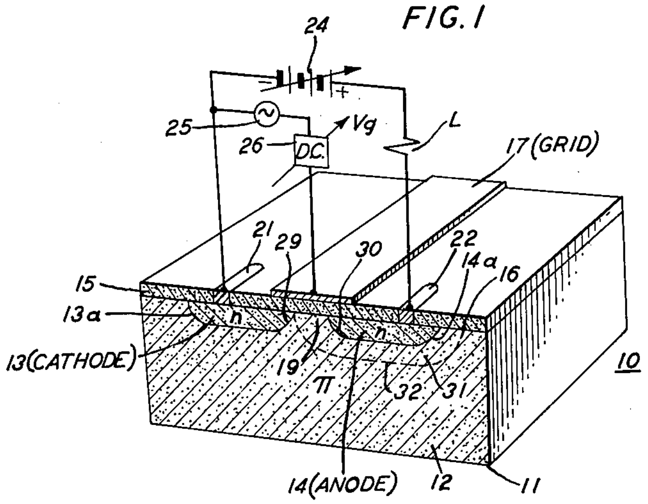
FIG. 1 is a diagram and schematic, partially in cross section, illustrating the principal elements of a semiconductor amplifier in accordance with this invention.

Referring to FIG. 1 in detail, the device 10 comprises a silicon wafer 11 including a bulk portion 12 of relatively high resistivity p-type material (designated as $\pi$-type) and two spaced surface portions 13 and 14 of relatively low resistivity n-type material extending laterally across a surface 16 of the wafer and forming rectifying junctions 13A and 14A, respectively, with the bulk. The silicon dioxide coating 15 covers the surface 16 of the wafer. Electrode 17 intimately contacts the portion of the oxide coating opposite the region 19 separating surface portions 13 and 14. Low resistance contacts 21 and 22 are connected to surface portions 13 and 14, respectively, and serve as the cathode and anode connections. A potential source, typically a battery 24, is serially connected with a load L between the contacts 21 and 22. The magntiude and sign of the applied voltage are such as to bias junction 14A in reverse and to extend the space charge layer associated with junction 14A across the region 19 to junction 13A. Therefore, the value of voltage V applied between contacts 21 and 22 can vary between some minimum value $V_m$ necessary to extend the space charge as required and the value $V_b$ at which the junction breaks down. A signal source 25 and a D.-C. source of grid bias voltage, typically a battery 26, are connected serially between the contact 21 and the electrode 17.

Figure 2:
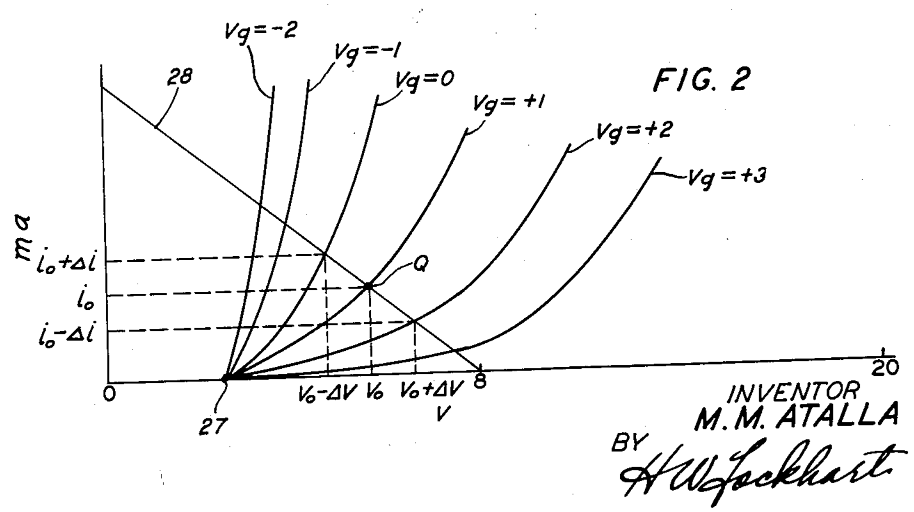
FIG. 2 is a graph representing the output current voltage characteristics of the embodiment of FIG. 1.

FIG. 2 is a graph representing typical voltage current characteristics exhibited between contacts 21 and 22 of FIG. 1 for different values of grid voltage $V_g$. The graph consists of a family of constant grid voltage $V_g$ curves having a mutual origin on the voltage axis at point 27. Point 27 corresponds to the minimum voltage V necessary to extend the space charge layer 31 associated with junction 14A across region 19. This customarily is called the punch-through voltage. The load line 28, corresponding to the load L, is shown intersecting each of the constant grid voltage curves. The operating point Q for a selected value of constant grid voltage is the point of intersection of the selected $V_g$ curve with the load line.

In response to a signal from signal source 25, an amplified response is developed at the load. For example, selecting the operating point Q and applying an alternating signal voltage $\Delta V$ between the grid and the cathode, the current through the load will vary from $I_0+\Delta i$ to $I_0-\Delta i$ repeatedly while the corresponding voltage across the load will vary from $V_0+\Delta V$ to $V_0-\Delta V$. Typically, the output current scale ranges from less than 0.1 milliampere to several milliamperes while the output voltage scale ranges from 5 to 20 volts.

Class A, B and C operation of the device can be obtained by appropriate adjustments of the grid bias voltage to limit operation to the linear portion of the dynamic transfer curve, to approximately the cut-off value, or to a value greater than cut-off in a manner well known in the vacuum tube art. Accordingly, the operation of the device is analogous to that of the vacuum tube triode.

The theory of operation is essentially as follows. The space charge region 31 generated about the reverse-biased junction 14A follows the geometry of the surface portion 14 and is bounded as indicated in cross section by broken line 32.

When the space charge region is extended across region 19 to intersect the p-n junction 13A an appreciable current flows. More specifically, junction 13A emits charge carriers, electrons for n-type material, into the region 19 which is now swept free of charge carriers by the space charge region 31. These carriers are collected by junction 14A and the resulting current flows between the electrodes from surface portion 13 through the load L to surface portion 14. Due to the potentially unlimited source of carriers and the finite transit time for each carrier to pass through region 19, the resulting current is space charge limited. That is, current increases with increasing voltage until at some particular value of voltage the current levels off, or saturates, and further large increases in voltage result in only very small current increases.

This current can be modulated by the electric field produced by the application of a signal between electrode 17 and contact 21. The mechanism of this modulation is twofold as can be understood with reference to FIGS. 2 and 3.

Figure 3:
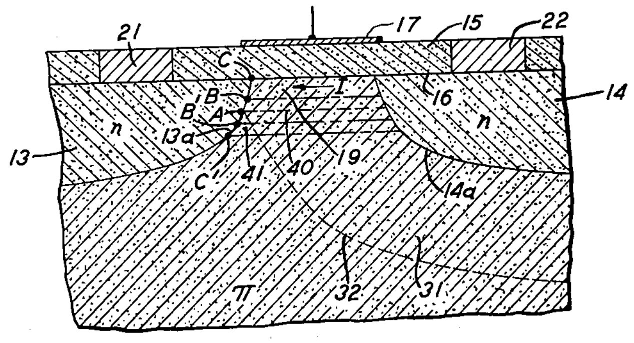
FIG. 3 is an enlarged view of a portion of the cross section of the embodiment of FIG. 1.

First, space charge region 31, the extent of which is demarcated by the broken line 32 of FIG. 3, will extend across the region 19 in response to some minimum bias voltage $V_m$ applied between the contacts 21 and 22. At this bias condition, the line 32 intersects p-n junction 13A at C and the junction begins to emit charge carriers, in this case electrons, as noted above. A bias voltage is now applied by D.-C. source 26 and the above intersection changes from C to A. This condition corresponds to the current $i_0$ of FIG. 2.

As is known, electrons flow because of a carrier concentration gradient giving rise to a diffusion current and because of an electric field giving rise to a drift current. In FIG. 3 the electrons flow from region 13 for the most part, because of the electric field resulting from a voltage applied between contacts 21 and 22. This drift current is limited, initially, only by the space charge of previously emitted electrons.

Upon application of a control voltage from A.-C. source 25 of FIG. 1 of a negative polarity between electrode 17 and contact 21, an accumulation of negative charges on electrode 17 results. An electric field originating on these charges terminates on the ionized impurities in the surface portions 13 and 14. As a result, an electron leaving surface portion 13 is opposed by an electric field in addition to the space charge described above and current decreases corresponding to a current $i_0-\Delta i$ of FIG. 2. Of course, an increase in the control voltage of this polarity further decreases the current flow.

Similarly, upon application of a control voltage of positive polarity, electrons in region 13 are accelerated by this electric field and current increases corresponding to a current $i_0+\Delta V$ of FIG. 2.

Secondly, the application of the control voltage of positive polarity from A.-C. source 25 induces an equal negative charge in the $\pi$ region. However, since the region 19 is swept free of charge carriers by the space charge region 31, the negative charge appears in the region 41 bounded by line 32 and p-n junction 13A. Also, since the bulk material is high resistivity p-type material, the negative charge in region 41 is the result of the depletion of holes in the region. The effect on the current flowing through region 19 is represented in FIG. 3 as a change in the intersection of line 32 and junction 13A from A to B′. The resulting increase in current is indicated by a corresponding increase in the width of the current path contributing to the current $i_0+\Delta i$ of FIG. 2. Further increase in the voltage is represented as a change in the intersection to C′. The width of the current path is determined as the distance between the horizontal line extending from the intersection of line 32 and junction 13A and the surface 16 of the wafer.

The application of a control voltage of negative polarity similarly induces an equal positive charge in the region 41 described above. Since holes are the majority carriers of the bulk material, positive charges are readily available for accumulation. The effect on the current flowing through region 19 is represented as a change in the intersection of line 32 and junction 13A from A to B. The resulting decrease in current is indicated by the corresponding decrease in the width of the current path contributing to the current $i_0-\Delta i$ of FIG. 2. Further increase in the voltage of this polarity is represented as a change in the intersection to C, at which the current drops substantially to zero. These variations are provided, typically, by superimposing a signal on the constant grid voltage impressed to establish the initial intersection A. The charge induced in region 41 becomes less important as the geometry of surface portions 13 and 14 becomes more rectangular.

The efficiency of modulation of the output current is thus seen to depend, partially, on the charge in region 41. It is important, therefore, that the charge in region 41 is fully responsive to changes in the electric field generated by the voltage applied between electrode 12 and contact 21.

However, it is recognized that the electric field is a surface phenomenon and is, therefore, effective as a control means only to a shallow depth. For example, in silicon the effectiveness of the electric field extends only to the order of 10,000 Angstrom units below the surface of the wafer. Therefore, in order for the charge in region 41 to be fully responsive to changes in the electric field, the intersection C′ should be no more than about 10,000 Angstrom units below the surface of the wafer for silicon devices in accordance with this invention. This is accomplished by diffusing surface portions 13 and 14 to a depth of 10,000 Angstrom units forming a rectangular cross section or, alternatively, arranging the geometry of the surface portions so that the two regions separate rapidly, beyond a critical separation, at the 10,000 Angstrom unit depth. The latter and more easily obtained geometry is shown in FIGS. 1 and 3.

As is stated above, operation of a device of the type described in FIG. 1 depends upon an initial minimum bias voltage applied between contacts 21 and 22 and this voltage V needs be less than the breakdown voltage $V_b$ of p-n junction 14A. Moreover, the wider the spacing W between p-n junctions 13A and 14A, the larger the minimum voltage required to extend the space charge region across W. The maximum field across W for V is obtained by integrating Poisson's equation:

$$\rightarrow \frac{4\pi}{K} q P_0 W \qquad (1)$$

where K is the dielectric constant of the semiconductor material, $q$ is the charge on an electron, and $P_0$ is the impurity concentration in the bulk portion of the wafer. Therefore, $$\frac{4\pi}{K} \frac{W}{\rho_\pi \mu_p} < E_b \qquad (2)$$

where $\rho_\pi$ is the resistivity of the bulk material, $\mu_p$ is the carrier mobility in the bulk material, and $E_b$ is the field corresponding to the breakdown voltage $V_b$. Then $$\frac{W}{\rho_\pi} < \frac{K}{4\pi} \mu_p E_b \qquad (3)$$

is the relationship necessary to determine the critical distance W. If the geometry of the two surface portions 13 and 14 allows for a separation greater than W at the 10,000 Angstrom unit depth, the effectiveness of the control mechanism is insured. Moreover, Equation 3 indicates that the lower the resistivity of the bulk region the smaller the distance W. Distances less than few microns present practical difficulties which are avoided by employing high resistivity material.

As in vacuum tube triodes, the amplification factor for devices in accordance with this invention depends on the ratio of the distance between the cathode and the anode to the distance between the grid and the anode. A typical amplification factor for embodiments of this invention is over 100 under ideal conditions.

The semiconductor element 10 described in FIG. 1 may be fabricated as follows: A silicon wafer having dimensions of .050 inch square and .010 inch thick and including a uniform concentration of $10^{13}$ boron atoms/cc. corresponding to a resistivity of about 1000 ohm centimeters is heated at a temperature of 1000 degrees centigrade in a water vapor atmosphere for 90 minutes to produce a silicon dioxide coating over the surface of the wafer. Photoresist techniques are next used to expose two suitably shaped portions of the underlying semiconductor surface separated by a distance of $10^{-3}$ centimeters. The wafer is subsequently exposed to a phosphorus pentoxide vapor utilizing the closed box diffusion technique disclosed in copending application Serial No. 740,958 of B. T. Howard, filed June 9, 1958. This diffusion provides two surface portions of n-type conductivity, each characterized by a surface concentration between $10^{20}$ and $10^{21}$ of phosphorus atoms/cc. The residual oxide is removed in concentrated hydrofluoric acid. The wafer is cleaned then in accordance with United States Patent No. 2,899,344, issued August 11, 1959, to M. M. Atalla, E. J. Schiebner and E. Tanenbaum, and oxidized in the steam bomb in accordance with United States Patent No. 2,930,822, issued March 29, 1960, to J. R. Ligenza. This oxidation step leaves an oxide coating over the entire device which is desirable in most cases and may be left undisturbed. In FIG. 1, however, the oxide is shown restricted to one surface of the device for clarity. A 3000 Angstrom unit coating of oxide is formed by heating the wafer at about 650 degrees centrigrade for 40 minutes at a pressure of 150 atmospheres. An aluminum electrode of about 1500 Angstrom units is evaporated thereafter onto the oxide coating opposite the two p-n junctions and the intervening space. Two holes are made subsequently through the oxide to the n-type surface portions and finally a gold lead is bonded to each exposed portion in a manner well known in the art.

In view of the fact that the semiconductor element of FIG. 1 is a three terminal device, it is possible to utilize the device in the way that vacuum tube triodes are customarily utilized. For example, the device can be incorporated into any of the basic amplifier circuits such as the grounded cathode, cathode follower or grounded grid arrangements by a suitable repositioning of the load.

No effort has been made to exhaust the possible embodiments of the invention. It will be understood that the embodiment described is merely illustrative of the preferred form of the invention and various modifications may be made therein without departing from the scope and spirit of the invention.

For example, although the invention is described in terms of silicon semiconductor material and a silicon dioxide dielectric coating, it should be apparent that other semiconductor materials and dielectric coatings are suitable.

What is claimed is:

1. In combination, a semiconductor wafer including a high resistivity bulk portion of one conductivity type and first and second spaced surface portions of opposite conductivity type, respectively, defining first and second spaced p-n junctions with said bulk, first and second low resistance contacts to said first and second surface portions, respectively, means for applying a first voltage between said first and second contacts to forward bias said first junction and reverse bias said second junction, said voltage having a value sufficiently large to extend the space charge region of said second p-n junction entirely across the separation between said first and second surface portions to establish space charge limited current flow between said surface portions, a dielectric coating overlying at least the region intermediate the surface portions, an electrode on said dielectric coating, and means for applying a second bias voltage between said electrode and the contact to said first surface portion for modulating said space charge limited current flow.

2. In combination, a silicon wafer including a high resistivity bulk portion and first and second low resistivity spaced surface portions of like conductivity type, respectively, defining first and second rectifying junctions with said bulk, first and second low resistance contacts to said first and second surface portions, respectively, means for applying a first voltage between said first and second contacts to forward bias said first junction and reverse bias said second junction, said voltage having a value sufficiently large to extend the space charge region of said second p-n junction entirely across the separation between said first and second surface portions to establish space charge limited current flow between said surface portions, a silicon dioxide coating overlying the space between the surface portions, an electrode on said oxide coating, and means for applying a second bias voltage between said electrode and the contact to said first surface portion for modulating said space charge limited current flow.

3. In combination, a silicon wafer including a high resistivity bulk portion and first and second spaced surface portions, respectively, defining first and second p-n junctions with said bulk, said spaced surface portions having an effective depth of less than 10,000 Angstrom units, and being spaced a distance less than 0.001 inch, first and second low resistance contacts to said first and second surface portions, respectively, a battery connected between said first and second contacts to forward bias said first junction and reverse bias said second punction, said battery supplying at least a minimum voltage necessary to extend the space charge region of said second p-n junction entirely across the separation between said first and second surface portions to establish space charge limited current between said surface portions, a silicon dioxide coating overlying at least the space between the surface portions, an electrode on said oxide coating, a second battery connected between said electrode and the contact to said first surface portion, and a signal source connected in series with said second battery for modulating said space charge limited current.

4. In combination, a silicon wafer including a high resistivity bulk portion and a major surface including first and second spaced surface portions, respectively, defining first and second p-n junctions with said bulk, first and second low resistance contacts to said first and second surface portions, respectively, means for applying a first voltage between said first and second contacts to forward bias said first junction and reverse bias said second junction, said voltage being sufficiently large to extend the space charge region of said second p-n junction entirely across the separation between said first and second surface portions to establish space charge limited current flow between said surface portions, said space charge limited current flow being limited to a path which extends less than about 10,000 Angstrom units from the said major surface, a silicon dioxide coating overlying the current path, an electrode on said dioxide coating, and means for applying a second bias voltage between said electrode and the contact to said first surface portion for modulating said space charge limited current flow.

References Cited in the file of this patent

UNITED STATES PATENTS 2,617,865 Bardeen et al. ___________ June 17, 1948